(12) United States Patent
Sadhu

(10) Patent No.: US 11,303,245 B2
(45) Date of Patent: Apr. 12, 2022

(54) PHASE NOISE REDUCTION USING TRIPLE-COIL TRANSFORMER COUPLING

(71) Applicant: International Business Machines Corporation, Armonk, NY (US)

(72) Inventor: Bodhisatwa Sadhu, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/870,357

(22) Filed: May 8, 2020

(65) Prior Publication Data

US 2021/0351745 A1 Nov. 11, 2021

(51) Int. Cl.
*H03B 5/12* (2006.01)

(52) U.S. Cl.
CPC ......... *H03B 5/1228* (2013.01); *H03B 5/1231* (2013.01); *H03B 2200/009* (2013.01)

(58) Field of Classification Search
CPC .................................................. H03B 5/1228
USPC ...................................................... 331/117 R
See application file for complete search history.

(56) References Cited

U.S. PATENT DOCUMENTS

| 8,773,215 | B2 | 7/2014 | Sadhu et al. |
| 9,172,326 | B2 | 10/2015 | Sanduleanu et al. |
| 9,197,221 | B2 * | 11/2015 | Babaie ..................... H03B 7/06 |
| 9,330,214 | B2 | 5/2016 | Valdes-Garcia et al. |
| 9,780,725 | B2 | 10/2017 | Chakrabarti et al. |
| 9,831,830 | B2 | 11/2017 | Valdes-Garcia et al. |
| 9,917,548 | B2 | 3/2018 | Valdes-Garcia et al. |
| 10,153,727 | B2 | 12/2018 | Anand et al. |
| 2010/0238843 | A1* | 9/2010 | Taghivand ........... H03B 5/1296 370/277 |
| 2014/0368285 | A1* | 12/2014 | Lu ........................ H03B 5/1243 331/117 FE |
| 2015/0214891 | A1 | 7/2015 | Shi et al. |
| 2016/0056762 | A1* | 2/2016 | Ximenes ............... H03M 1/002 331/117 FE |
| 2016/0056799 | A1 | 2/2016 | Ximenes et al. |

(Continued)

FOREIGN PATENT DOCUMENTS

KR 100952424 B1 8/2009

OTHER PUBLICATIONS

Sadhu, B., et al., "A Linearized, Low-Phase-Noise VCO-Based 25-GHz PLL With Autonomic Biasing", IEEE Journal of Solid-State Circuits, May 2013, pp. 1138-1150, vol. 48, No. 5.

(Continued)

*Primary Examiner* — Joseph Chang
(74) *Attorney, Agent, or Firm* — Scully, Scott, Murphy & Presser, P.C.; Daniel P. Morris

(57) ABSTRACT

Methods and systems for reducing phase noise in a voltage controlled oscillator (VCO) are described. In an example, a first transistor, a second transistor, a third transistor, and a fourth transistor, can be provided. A transformer can be used to decouple drain terminals and gate terminals of the first, second, third, and fourth transistors. An oscillation amplitude of the VCO can be increased by providing a first bias voltage to the transformer to adjust gate bias voltages of the first and second transistors. The oscillation amplitude of the VCO can also be increased by providing a second bias voltage to the transformer to adjust gate bias voltages of the third and the fourth transistors.

17 Claims, 6 Drawing Sheets

(56) References Cited

U.S. PATENT DOCUMENTS

| | | | |
|---|---|---|---|
| 2016/0099681 A1* | 4/2016 | Zong | H03B 5/1296 331/117 FE |
| 2016/0226441 A1 | 8/2016 | Valdes-Garcia et al. | |
| 2017/0331430 A1 | 11/2017 | Anand et al. | |
| 2018/0097475 A1* | 4/2018 | Djahanshahi | H03B 27/00 |
| 2018/0309406 A1 | 10/2018 | Yun | |

OTHER PUBLICATIONS

Ferriss, M., et al., "A 12-to-26GHz Fractional-N PLL with Dual Continuous Tuning LC-D/VCOs", 2016 IEEE International Solid-State Circuits Conference, ISSCC 2016, Feb. 2, 2016, pp. 196-198.

Murphy, D., et al., "A27-GHz Quad-Core CMOS Oscillator With No Mode Ambiguity", IEEE Journal of Solid-State Circuits, Nov. 2018, pp. 3208-3216, vol. 53, No. 11.

Wachi, Y., et al., "A 28GHz Low-Phase-Noise CMOS VCO Using an Amplitude-Redistribution Technique", 2008 IEEE International Solid-State Circuits Conference, ISSCC 2008, Feb. 6, 2008, pp. 482-484.

Sadhu, B., et al., "A Fully Decoupled LC Tank VCO Topology for Amplitude Boosted Low Phase Noise Operation", IEEE Journal of Solid-State Circuits, Sep. 2018, pp. 2488-2499, vol. 53, No. 9.

Ferriss, M., et al., "A Gradient Descent Bias Optimizer for Oscillator Phase Noise Reduction Demonstrated in 45nm and 32nm SOI CMOS", IEEE Radio Frequency Integrated Circuits Symposium, Date of Conference: Jun. 10-12, 2018, pp. 344-347, Conference Location: Philadelphia, PA.

Valdes-Garcia, A., et al., "A Fully-Integrated Dual-Polarization 16-Element W-band Phased-Array Transceiver in SiGe BiCMOS", IEEE Radio Frequency Integrated Circuits Symposium, Date of Conference: Jun. 2-4, 2013, pp. 375-378, Conference Location: Seattle, WA.

\* cited by examiner

PHASE NOISE REDUCTION USING TRIPLE-COIL TRANSFORMER COUPLING

BACKGROUND

The present disclosure relates in general to voltage controlled oscillators (VCO) implemented with triple-coil transformer to reduce phase noise during operation.

Voltage controlled oscillator (VCO) can be used in radio frequency communication systems. A VCO can switch inverters to generate an oscillating signal, and the frequency of the oscillating signal can be controlled by a control voltage being applied to an inductor-capacitor (LC) resonant circuit.

SUMMARY

In some examples, a device for reducing phase noise is generally described. The device can include a first transistor having a first gate terminal and a first drain terminal. The device can further include a second transistor having a second gate terminal and a second drain terminal. The device can further include a third transistor having a third gate terminal and a third drain terminal. The third drain terminal can be connected to the first drain terminal at a first node. The device can further include a fourth transistor having a fourth gate terminal and a fourth drain terminal. The fourth drain terminal can be connected to the second drain terminal at a second node. The device can further include a transformer that decouples the first, second, third, and fourth drain terminals from the first, second, third, and fourth gate terminals.

In some examples, an apparatus for reducing phase noise is generally described. The apparatus can include a first circuit having a first current source. The apparatus can further include a second circuit having a second current source. The apparatus can further include a device. The device can include a first transistor having a first gate terminal and a first drain terminal. The device can further include a second transistor having a second gate terminal and a second drain terminal. The device can further include a third transistor having a third gate terminal and a third drain terminal. The third drain terminal can be connected to the first drain terminal at a first node. The device can further include a fourth transistor having a fourth gate terminal and a fourth drain terminal. The fourth drain terminal can be connected to the second drain terminal at a second node. The device can further include a transformer that decouples the first, second, third, and fourth drain terminals from the first, second, third, and fourth gate terminals. The first circuit can be configured to provide a first bias voltage to the transformer to adjust gate bias voltages of the first and second transistors. The second circuit can be configured to provide a second bias voltage to the transformer to adjust gate bias voltages of the third and fourth transistors. The adjustment of the gate bias voltages of the first and second transistors, and the adjustment of the gate bias voltages of the third and fourth transistors, can increase an oscillation amplitude of the device.

In some examples, a method for reducing phase noise in a voltage controlled oscillator (VCO) is generally described. The method can include providing a first transistor having a first gate terminal and a first drain terminal, a second transistor having a second gate terminal and a second drain terminal, a third transistor having a third gate terminal and a third drain terminal, and a fourth transistor having a fourth gate terminal and a fourth drain terminal. The method can further include decoupling the first, second, third, and fourth drain terminals from the first, second, third, and fourth gate terminals using a transformer. The method can further include increasing an oscillation amplitude of the VCO by providing a first bias voltage to the transformer to adjust gate bias voltages of the first transistor and the second transistor. The method can further include increasing an oscillation amplitude of the VCO by providing a second bias voltage to the transformer to adjust gate bias voltages of the third transistor and the fourth transistor.

Further features as well as the structure and operation of various embodiments are described in detail below with reference to the accompanying drawings. In the drawings, like reference numbers indicate identical or functionally similar elements.

DETAILED DESCRIPTION

In some examples, operation of a VCO can result in large voltage swing, causing phase noise that can affect an accuracy of the output signal. The VCO architecture described in accordance with the present disclosure can adjust or tune a drain voltage swing and a gate voltage swing of the VCO independently. The independent adjustment can allow the transistors among the VCO to operate in reduced triode operation regime. The reduced triode operation regime can reduce phase noise in the output signal generated by the VCO.

Figure 1:
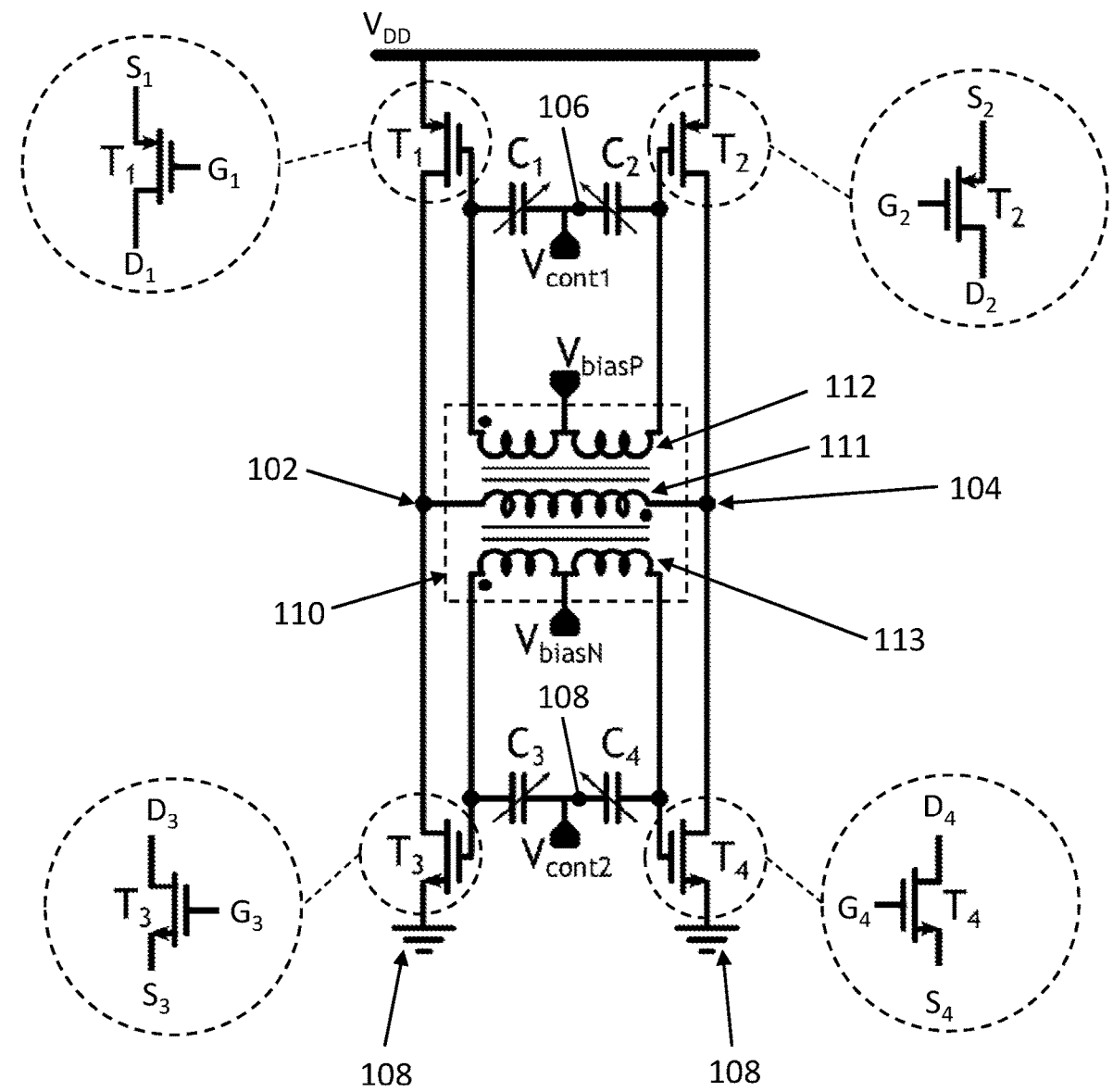
FIG. 1 is a diagram showing an example device that can implement phase noise reduction using triple-coil transformer coupling in one embodiment.

FIG. 1 is a diagram showing an example device 100 that can implement phase noise reduction using triple-coil transformer coupling in one embodiment. The device 100 can be a voltage controlled oscillator (VCO) controlled by a control voltage (e.g., direct current (DC) voltage). A VCO can output a varying signal having an oscillation frequency directly related to the input voltage being used to control the VCO. The device 100 can include a first transistor labeled as $T_1$, a second transistor labeled as $T_2$, a third transistor labeled as $T_3$, and a fourth transistor labeled as $T_4$. In an example embodiment, the first transistor $T_1$ and the second transistor $T_2$ can be P-type metal-oxide-semiconductor (PMOS) transistors, and the third transistor $T_3$ and the fourth transistor $T_4$ can be N-type metal-oxide-semiconductor (NMOS) transistors. In another example embodiment, the first transistor $T_1$ and the second transistor $T_2$ can be PNP bipolar transistors, and the third transistor $T_3$ and the fourth transistor $T_4$ can be NPN bipolar transistors. The first transistor $T_1$ and the third transistor $T_3$ can form an inverter, and the second transistor $T_2$ and the fourth transistor $T_4$ can form another inverter. The first transistor $T_1$ and the second transistor $T_2$ can mirror each other, and the third transistor $T_3$ and the fourth transistor $T_4$ can mirror each other. The first transistor $T_1$ can have a drain terminal $D_1$, a source terminal $S_1$, and a gate terminal $G_1$. The first transistor $T_2$ can have a drain terminal $D_2$, a source terminal $S_2$, and a gate terminal $G_2$. The first transistor $T_3$ can have a drain terminal $D_3$, a source terminal $S_3$, and a gate terminal $G_3$. The first transistor $T_4$ can have a drain terminal $D_4$, a source terminal $S_4$, and a gate terminal $G_4$.

The device 100 can further include a transformer 110, where the transformer 110 can be a triple coil transformer having three windings formed by conductors. In the example shown in FIG. 1, the transformer 110 can include a first winding 111, a second winding 112, and a third winding 113. The first winding 111 can be a coil having one turn, where the number of turns for the first winding 111 can be denoted as $n_1$ and $n_1=1$. The second winding 112 can be a coil having $n_2$ turns and the third winding 113 can be a coil having $n_3$ turns. The values of $n_2$ and $n_3$ can be integers greater than or equal to one. The values of $n_2$ and $n_3$ can be equal or different, depending on a desired implementation of the device 100.

The gate terminals $G_1$, $G_2$, $G_3$, and $G_4$ and the drain terminals $D_1$, $D_2$, $D_3$, and $D_4$, can be connected to the transformer 110. The source terminals $S_1$ and $S_2$ can be connected to a line configured to receive power supply voltage $V_{DD}$. The source terminals $S_3$ and $S_4$ can be connected to a ground terminal (or ground) 108. The drain terminal $D_1$ can be connected to the drain terminal $D_3$ at a node 102. The drain terminal $D_2$ can be connected to the drain terminal $D_4$ at a node 104. The second winding 112 can be connected between the gate terminals $G_1$ and $G_2$. The third inductor can be connected between the gate terminals $G_3$ and $G_4$. The first winding 111 can be connected to the drain terminals $D_1$, $D_2$, $D_3$, and $D_4$ at the nodes 102 and 104. The connection of the inductors 111, 112, 113, with respect to the gate and drain terminals of the transistors $T_1$, $T_2$, $T_3$, $T_4$, shown in FIG. 1, can decouple the nodes 102 and 104 from the gate terminals $G_1$, $G_2$, $G_3$, and $G_4$. Decoupling the nodes 102 and 104 causes the drain terminals $D_1$, $D_2$, $D_3$, and $D_4$ to be decoupled from their corresponding gate terminals $G_1$, $G_2$, $G_3$, and $G_4$.

The second winding 112 can include a tap configured to receive a bias voltage labeled as $V_{biasP}$. The bias voltage $V_{biasP}$ can be transmitted from the second winding 112 to the gate terminals $G_1$ and $G_2$ to adjust the gate bias voltages of the transistors $T_1$ and $T_2$. The third winding 113 can include a tap configured to receive a bias voltage labeled as $V_{biasN}$. The bias voltage $V_{biasN}$ can be transmitted from the third winding 113 to the gate terminals $G_3$ and $G_4$ to adjust the gate bias voltages of the transistors $T_3$ and $T_4$. Based on the nodes 102 and 104 (or the drain terminals $D_1$, $D_2$, $D_3$, and $D_4$) being decoupled from the gate terminals $G_1$, $G_2$, $G_3$, and $G_4$ by the transformer 110, different values of bias voltages (e.g., bias voltages $V_{biasP}$ and $V_{biasN}$) can be used to individually or independently adjust the drain voltage and the gate voltage of the transistors $T_1$, $T_2$, $T_3$, $T_4$. A drain voltage of a transistor can be a voltage being measured at a drain terminal of the transistor, and a gate voltage of the transistor can be voltage being measured at a gate terminal of the transistor. For example, voltage being measured at the node 102 can be drain voltages of the transistors $T_1$ and $T_3$, and voltage being measured at the node 104 can be drain voltages of the transistors $T_2$ and $T_4$. Voltage being measured at a point between the gate terminals $G_1$ and $G_2$, such as a node 106, can be the gate voltages of the transistors $T_1$ and $T_2$. Voltage being measured at a point between the gate terminals $G_3$ and $G_4$, such as a node 108, can be the gate voltages of the transistors $T_3$ and $T_4$.

When a transistor among the device 100 has its gate-to-drain voltage greater than its threshold voltage, the transistor can be operating in the triode region. The triode region can cause distortion in current flowing through the device 100. The independent adjustment of drain and gate voltages of a transistors $T_1$, $T_2$, $T_3$, $T_4$ can adjust the difference between their gate-to-drain voltages and threshold voltages. This adjustment can be used to reduce occurrences of triode operation. Further, the reduction in triode operation can improve a linearity of the device transconductance of device 100. By improving the linearity of the device transconductance, oscillation amplitude of the device 100 can be increased. The increased oscillation amplitude can lead to lower active noise, improving signal-to-noise ratio (SNR), and reduction of phase noise of the device 110. In an example, one or more of the bias voltages $V_{biasP}$ and $V_{biasN}$ can be adjusted until a right combination of $V_{biasP}$ and $V_{biasN}$ maximizes the oscillation amplitude of the device 100. The current mirror biasing between the mirrored pairs of transistors (e.g., $T_1$-$T_2$ pair, and $T_3$-$T_4$ pair) can reduce process, voltage, or temperature variation if the same kind of devices (e.g., transistors) are used in the mirror (e.g., they can track each other even if process, voltage and temperature change occurs). Furthermore, avoiding triode region operation can reduce flicker noise upconversion to phase noise in the device 100. For example, phase noise can sometimes be dominated by flicker noise upconverted inside the device 100. Such up-conversion mechanisms can be suppressed if triode operation is reduced. Still further, a voltage controlled oscillator (VCO) phase noise performance can be curtailed by low supply voltages. Also, the independent adjustment of drain and gate voltages can allow a VCO to operate in low supply voltage mode without a need to stack current source transistors. For example, a current source transistor can be stacked on top or below the VCO (e.g., device 100) for current control in some configurations. By decoupling the gate and drain nodes, it is possible to control the current of the VCO by controlling the gate bias voltages independently using current mirrors. If the current biasing transistor is not stacked with the VCO, the VCO can operate with low supply voltage and achieve low phase noise despite the lowered supply voltage in advanced integrated circuit technology nodes.

A pair of circuit elements or components labeled as $C_1$ and $C_2$ can be connected between the gate terminals $G_1$ and $G_2$. Another pair of circuit elements of components labeled as $C_3$ and $C_4$ can be connected between the gate terminals $G_3$ and $G_4$. The circuit elements $C_1$, $C_2$, $C_3$, and $C_4$ can be, for example, capacitors, varactors, a proxy for a set of switched capacitors, or a combination of varactors and switched capacitors, and/or other types of circuit elements with adjustable capacitance. The capacitance of the pair of elements $C_1$, $C_2$ can be adjusted based on an input control voltage labeled as $V_{cont1}$, and the pair of elements $C_3$, $C_4$ can be adjusted based on an input control voltage labeled as $V_{cont2}$. Based on the transformer 110 decoupling the gate terminals $G_1$, $G_2$, $G_3$ and $G_4$ from the drain terminals $D_1$, $D_2$, $D_3$, $D_4$, the value of $V_{cont1}$ and $V_{cont2}$ can be different. The different control voltages $V_{cont1}$ and $V_{cont2}$ can provide individual amounts of capacitance adjustments to the pair $C_1$, $C_2$, and the pair $C_3$, $C_4$. The adjustment of the capacitance of elements $C_1$, $C_2$, $C_3$, and $C_4$ can adjust or tune an oscillation frequency of the device 100. In an example, the independent adjustment of the pair of elements $C_1$, $C_2$, and the pair of elements $C_3$, $C_4$ can lower sensitivity to capacitance changes, which reduces phase locked loop (PLL) voltage to frequency gain, and leads to reduction of phase noise.

Figure 2:
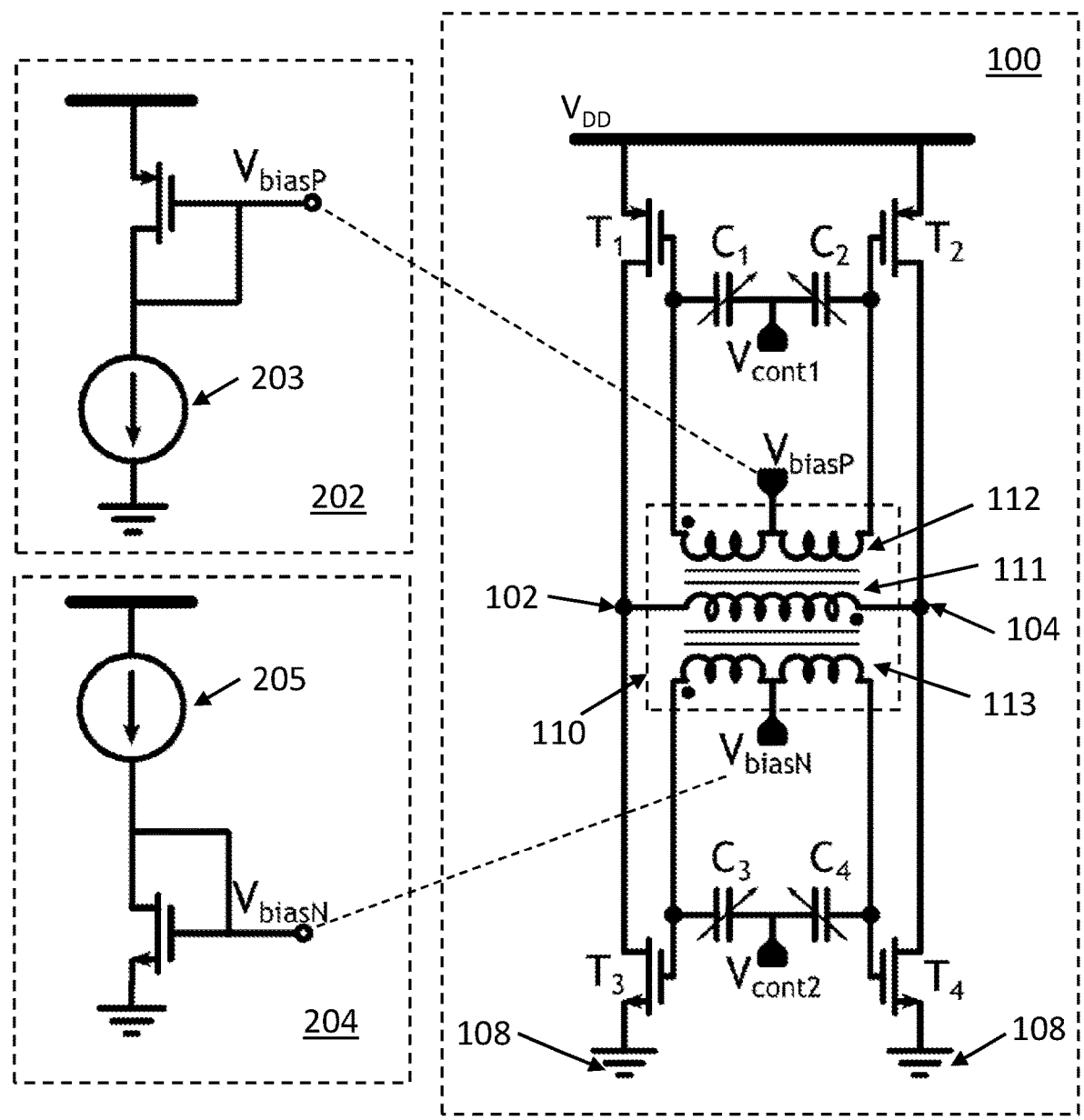
FIG. 2 is a diagram showing an example apparatus that can implement phase noise reduction using triple-coil transformer coupling in one embodiment.

FIG. 2 is a diagram showing an example apparatus 200 that can implement phase noise reduction using triple-coil transformer coupling in one embodiment. The apparatus 200 can include the device 100, a circuit 202, and a circuit 204. The circuits 202 and 204 can be bias voltage circuits configured to generate bias voltages $V_{biasP}$ and $V_{biasN}$, respectively. The circuit 202 can include a current source 203, where adjustments to the current outputted by the current source 203 can adjust the bias voltage $V_{biasP}$. The circuit 204 can include a current source 205, where adjustments to the current outputted by the current source 205 can adjust the bias voltage $V_{biasN}$. The circuits 202 and 204 can provide bias voltages $V_{biasP}$ and $V_{biasN}$ to the device 100 to adjust gate bias voltages of the transistors $T_1$, $T_2$, $T_3$, and $T_4$.

Figure 3A:
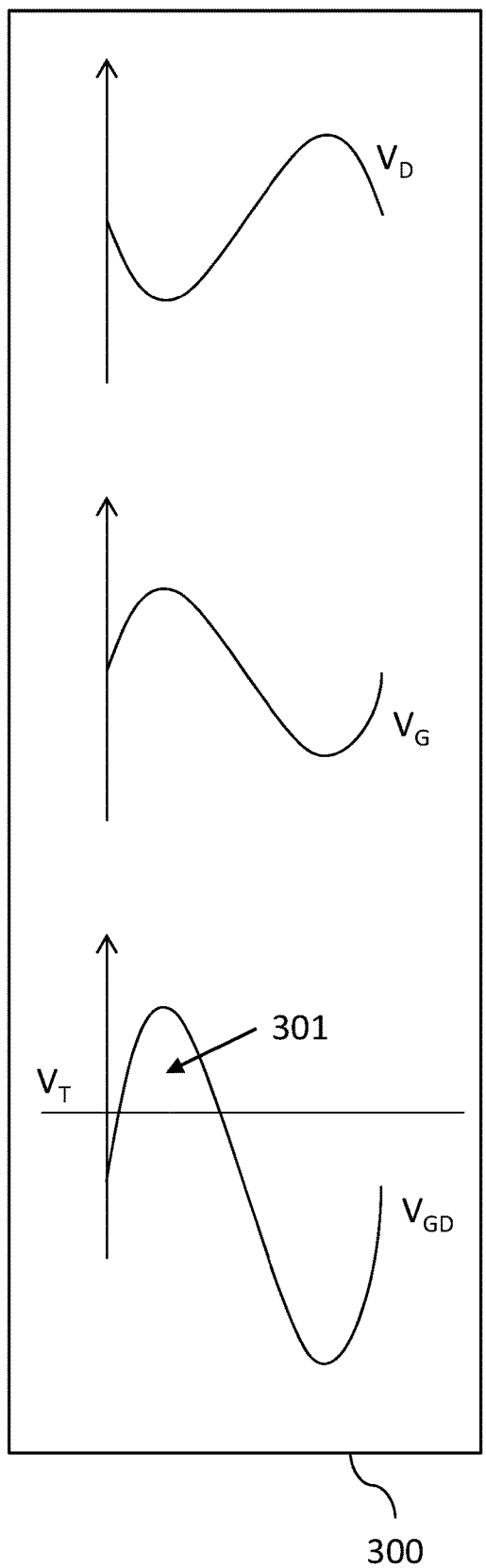
FIG. 3A is a diagram showing an example result of an implementation of phase noise reduction using triple-coil transformer coupling in one embodiment.
Figure 3B:
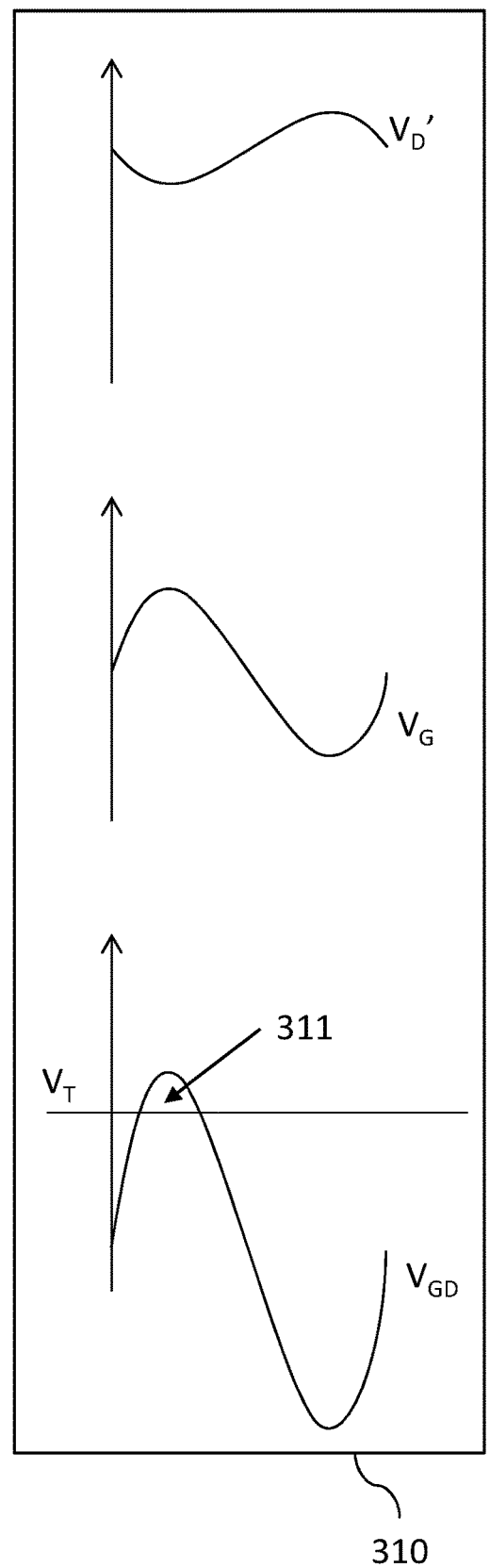
FIG. 3B is a diagram showing an example result of an implementation of phase noise reduction using triple-coil transformer coupling in one embodiment.

FIGS. 3A and 3B are diagrams showing example results of implementations of phase noise reduction using triple-coil transformer coupling in one embodiment. The independent adjustment of the drain voltage and gate voltage of the device 100 can result in a reduction of phase noise during operation of the device 100. In an example, operation of the device 100 can include switching a first inverter formed by the transistors $T_1$ and $T_3$, and a second inverter formed by the transistors $T_2$ and $T_4$, alternatively. The timing in which the first and second inverters are being switch can generate the frequency of the output signal from the device 100. The gate-to-drain voltage, denoted as $V_{GD}$, of a transistor can be equivalent to a difference between a gate-to-source voltage $V_{GS}$ and a drain-to-source voltage $V_{DS}$. When $V_{GD}$ is greater than the threshold voltage $V_T$ of the transistor, the transistor is said to be operating in a triode region. One or more transistors among $T_1$, $T_2$, $T_3$, $T_4$ operate in the triode region can cause distortion in the current flowing through the device 100. Such distortions can increase nonlinearity and introduce phase noise to the output signal being outputted by the device 100.

By using the transformer 110 to decouple the drain terminals $D_1$, $D_2$, $D_3$, $D_4$ from the gate terminals from the gate terminals $G_1$, $G_2$, $G_3$ and $G_4$, the drain voltages and the gate voltages of the transistors $T_1$, $T_2$, $T_3$, $T_4$ can be adjusted independently. The independent adjustment of the drain voltages and the gate voltages can reduce the amount of occurrences where $V_{GD}$ is greater than $V_T$, leading to reduction of triode region operation by transistors $T_1$, $T_2$, $T_3$, $T_4$ and reduction of phase noise during operation of the device 100.

In FIG. 3A, an example 300 showing waveforms of a drain voltage $V_D$, a gate voltage $V_G$, and a gate-to-drain voltage $V_{GD}$, of a transistor is presented. Using the transistor $T_3$ of the device 100 as an example, $V_D$ can be a voltage measured at the node 102 that is connected to the drain terminal $D_3$, and $V_G$ can be a voltage measured at the node 108 that is connected to the gate terminal $G_3$. The threshold $V_T$ can be a threshold voltage of the transistor $T_3$, and note that when $V_{GD}$ exceeds $V_T$, the transistor $T_3$ is operating in the triode region 301.

The drain voltage $V_D$ can be adjusted to a new voltage, such as $V_D'$, using the bias voltage $V_{biasN}$ and/or the control voltage $V_{cont2}$. In an example shown in FIG. 3B, when the gate voltage VG is maintained (same as example in FIG. 3A) and the drain voltage is adjusted from $V_D$ to $V_D'$, the newly formed triode region 311 is smaller compared to the triode region 301. Note that if the drain terminal $D_3$ is connected to the gate terminal $G_3$, the drain voltage $V_D$ cannot be adjusted without changing $V_G$ as well. By using the transformer 110 to decouple the drain terminals $D_1$, $D_2$, $D_3$, and $D_4$ from their corresponding gate terminals $G_1$, $G_2$, $G_3$, and $G_4$, the drain voltages and gate voltages of the transistors $T_1$, $T_2$, $T_3$, $T_4$ can be adjusted independently.

Figure 4A:
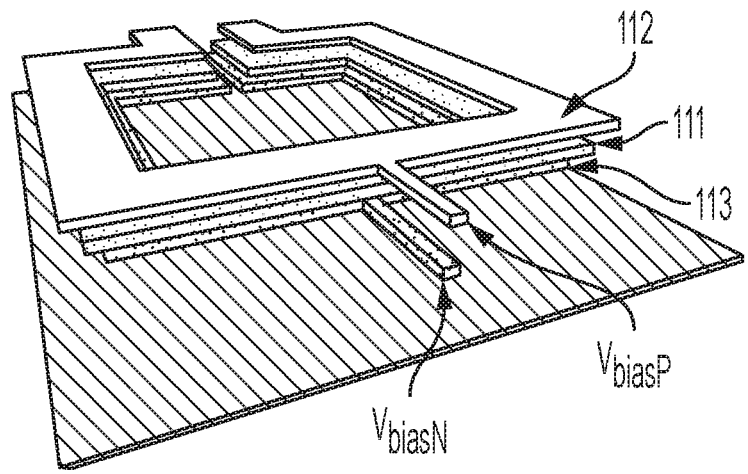
FIG. 4A is a diagram showing one example layout of a transformer that can be used to implement phase noise reduction using triple-coil transformer coupling in one embodiment.
Figure 4B:
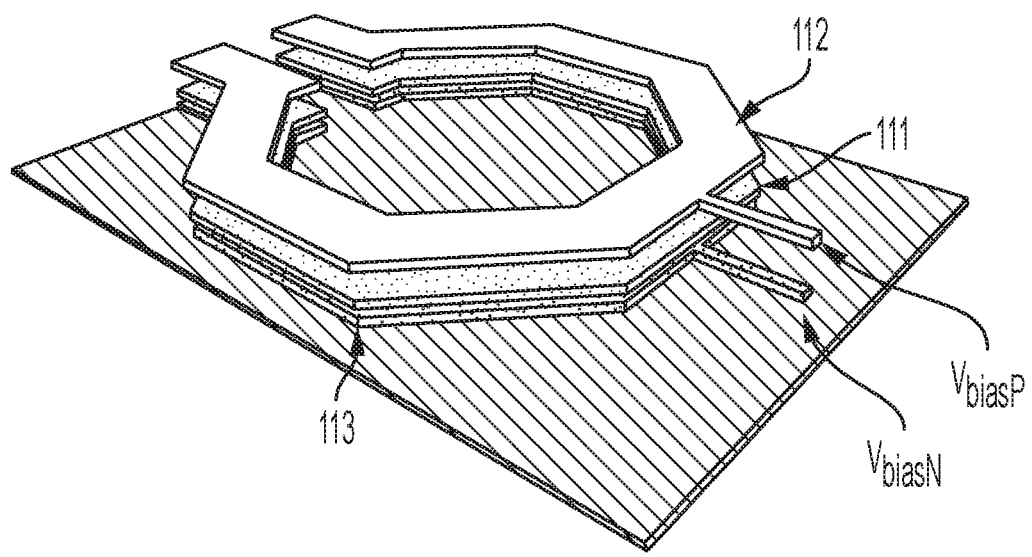
FIG. 4B is a diagram showing one example layout of a transformer that can be used to implement phase noise reduction using triple-coil transformer coupling in one embodiment.
Figure 4C:
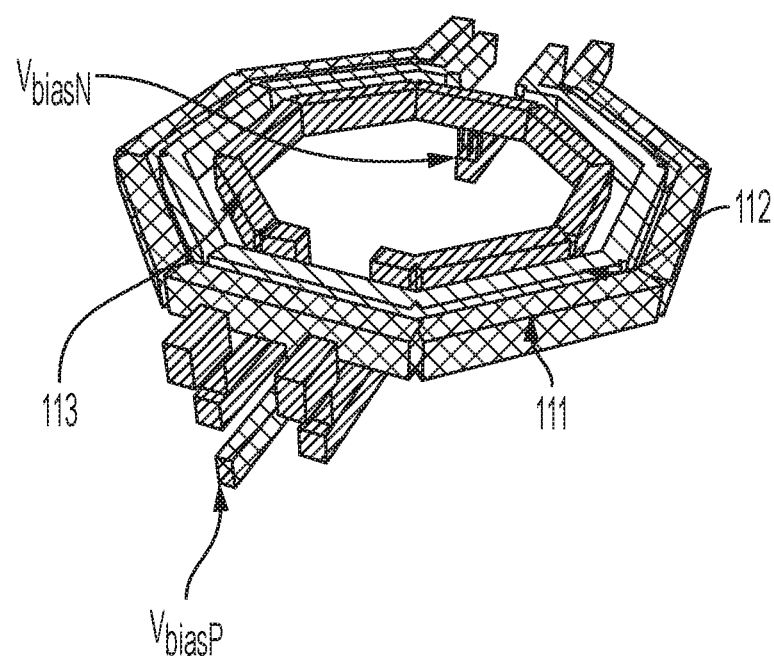
FIG. 4C is a diagram showing one example layout of a transformer that can be used to implement phase noise reduction using triple-coil transformer coupling in one embodiment.

FIGS. 4A, 4B, 4C are diagrams showing example layouts of a transformer that can be used to implement phase noise reduction using triple-coil transformer coupling. In an example shown in FIG. 4A, the transformer 110 in FIG. 1 can have a square multi-radii layout. The first winding 111 can have one square-shaped loop of coil. Although the second winding 112 and the third winding 113 are shown as having one square-shaped loop of coil, the second winding 112 and the third winding 113 can have additional loops depending on a desired implementation of the device 100.

In another example shown in FIG. 4B, the transformer 110 in FIG. 1 can have an octagonal equi-radii layout. The first winding 111 can have one octagonal-shaped loop of coil. Although the second winding 112 and the third winding 113 are shown as having one octagonal-shaped loop of coil, the second winding 112 and the third winding 113 can have additional loops depending on a desired implementation of the device 100.

In another example shown in FIG. 4C, the transformer 110 in FIG. 1 can have a octagonal coplanar layout. The first winding 111 can have one octagonal-shaped loop of coil. Although the second winding 112 and the third winding 113 are shown as having one octagonal-shaped loop of coil of respective size, the second winding 112 and the third winding 113 can have additional loops and arbitrary size depending on a desired implementation of the device 100.

Figure 5:
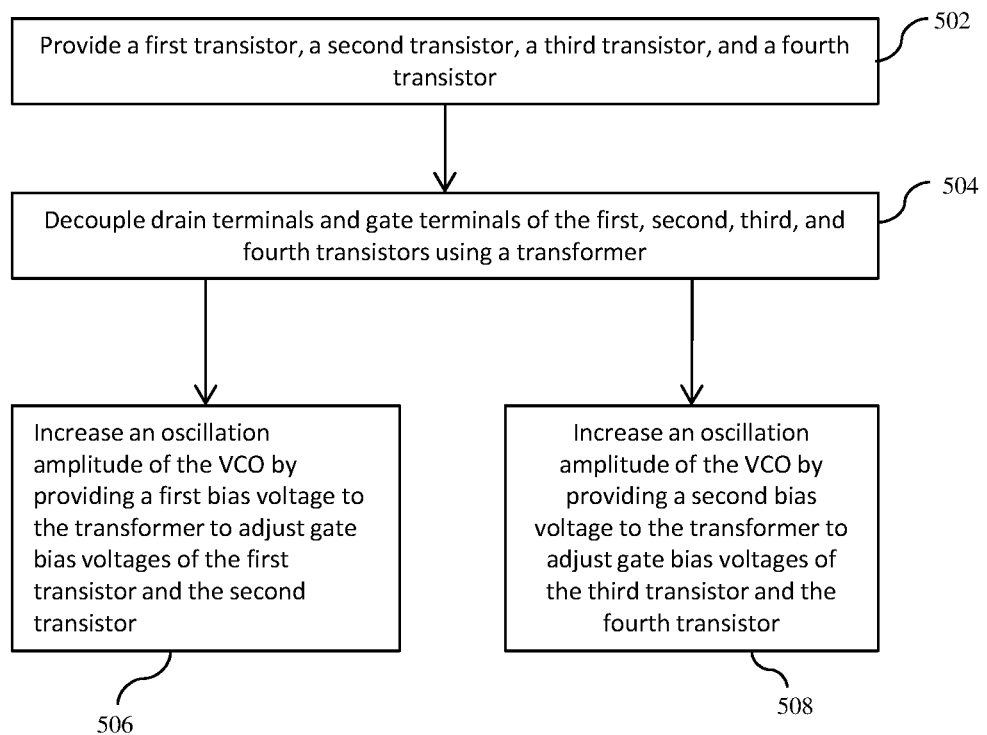
FIG. 5 a flow diagram illustrating a process that can be performed by a device implementing phase noise reduction using triple-coil transformer coupling in one embodiment.

FIG. 5 a flow diagram illustrating a process 500 that can be performed by a device implementing phase noise reduction using triple-coil transformer coupling in one embodiment. An example process 500 may include one or more operations, actions, or functions as illustrated by one or more of blocks 502, 504, 506, and/or 508. Although illustrated as discrete blocks, various blocks can be divided into additional blocks, combined into fewer blocks, eliminated, or performed in parallel, depending on the desired implementation.

The process 500 can be implemented for reducing phase noise in a voltage controlled oscillator (VCO). The process can being at block 502, where a first transistor, a second transistor, a third transistor, and a fourth transistor can be provided. The first transistor can include a first gate terminal and a first drain terminal. The second transistor can include a second gate terminal and a second drain terminal. The third transistor can include a third gate terminal and a third drain terminal. The fourth transistor can include a fourth gate terminal and a fourth drain terminal. In an example, the transformer can include a first winding, a second winding, and a third winding. The first winding can be connected between the first node and the second node. The first winding can be magnetically coupled to the second winding and the third winding. The second winding can be connected between the first gate terminal and the second gate terminal. The third winding can be connected between the third gate terminal and the fourth gate terminal. The process 500 can continue from block 502 to block 504. At block 504, a transformer can be used to decouple the first, second, third, and fourth drain terminals from the first, second, third, and fourth gate terminals using a transformer.

The process 500 can continue from block 504 to block 506. At block 506, an oscillation amplitude of the VCO can be increased by providing a first bias voltage to the transformer to adjust gate bias voltages of the first transistor and the second transistor. The process 500 can also continue from block 504 to block 508. At block 508, the oscillation amplitude of the VCO can be increased by providing a second bias voltage to the transformer to adjust gate bias voltages of the third transistor and the fourth transistor. In an example, at least one of the first and second bias voltages can be adjusted to maximize the oscillation amplitude of the VCO. In some examples, the drain voltages measured at the first, second, third, and fourth drain terminals, and the gate voltages measured at the first, second, third, and fourth gate terminals, can vary independently.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device comprising:
   a first transistor having a first gate terminal and a first drain terminal;
   a second transistor having a second gate terminal and a second drain terminal;
   a third transistor having a third gate terminal and a third drain terminal, the third drain terminal being connected to the first drain terminal at a first node;
   a fourth transistor having a fourth gate terminal and a fourth drain terminal, the fourth drain terminal being connected to the second drain terminal at a second node; and
   a transformer that decouples the first, second, third, and fourth drain terminals from the first, second, third, and fourth gate terminals, the transformer comprising a coil having one turn;
   a first pair of circuit elements connected between the first and second gate terminals of the first and second transistors, respectively, wherein a first control voltage received by the first pair of circuit elements adjusts capacitance of the first pair of circuit elements; and
   a second pair of circuit elements connected between the third and fourth gate terminals of the third and fourth transistors, respectively, wherein a second control voltage received by the second pair of circuit elements adjusts capacitance of the second pair of circuit elements, wherein the adjustment to the capacitance of the first pair of circuit elements and the adjustment to the capacitance of the second pair of circuit elements are independent;
   wherein the transformer is configured to:
      receive a first bias voltage to adjust gate bias voltages of the first and second transistors through a first tap of the transformer; and
      receive a second bias voltage to adjust gate bias voltages of the third and fourth transistors through a second tap of the transformer;
   wherein the adjustment to the gate bias voltages of the third and fourth transistors is independent from gate bias voltages of the first and second transistors;
   wherein a combination of the first bias voltage and the second bias voltage increases an oscillation amplitude of a voltage controlled oscillator (VCO) including the transformer, the first, second, third, and fourth transistors, and the first and second pairs of circuit elements; and
   wherein the combination of the first bias voltage and the second bias voltage decreases a triode operation region of one or more of the first, second, third, and fourth transistors.

2. The device of claim 1, wherein:
   the transformer comprises a first winding, a second winding, and a third winding, the first winding being the coil having one turn;

the first winding is connected between the first node and the second node, and the first winding is magnetically coupled to the second winding and the third winding;

the second winding is connected between the first gate terminal and the second gate terminal; and the third winding is connected between the third gate terminal and the fourth gate terminal.

3. The device of claim 1, wherein the transformer is configured to continue to receive different values of the first bias voltage and the second bias voltage until the combination of the first bias voltage and the second bias voltage maximized the oscillation amplitude of the VCO.

4. The device of claim 1, wherein the first transistor and the second transistor are P-type metal-oxide-semiconductor (PMOS) transistors, and the third transistor and the fourth transistor are N-type metal-oxide-semiconductor (NMOS) transistors.

5. The device of claim 1, wherein the first transistor and the second transistor are PNP bipolar transistors, and the third transistor and the fourth transistor are NPN bipolar transistors.

6. The device of claim 1, wherein drain voltages measured at the first, second, third, and fourth drain terminals and gate voltages measured at the first, second, third, and fourth gate terminals vary independently.

7. An apparatus comprising:
a first circuit having a first current source;
a second circuit having a second current source;
a device comprising:
  a first transistor having a first gate terminal and a first drain terminal;
  a second transistor having a second gate terminal and a second drain terminal;
  a third transistor having a third gate terminal and a third drain terminal, the third drain terminal being connected to the first drain terminal at a first node;
  a fourth transistor having a fourth gate terminal and a fourth drain terminal, the fourth drain terminal being connected to the second drain terminal at a second node;
  a transformer that decouples the first, second, third, and fourth drain terminals from the first, second, third, and fourth gate terminals, the transformer comprising a coil having one turn;
  a first pair of circuit elements connected between the first and second gate terminals of the first and second transistors, respectively, wherein a first control voltage received by the first pair of circuit elements adjusts capacitance of the first pair of circuit elements; and
  a second pair of circuit elements connected between the third and fourth gate terminals of the third and fourth transistors, respectively, wherein a second control voltage received by the second pair of circuit elements adjusts capacitance of the second pair of circuit elements, and the adjustment to the capacitance of the first pair of circuit elements and the adjustment to the capacitance of the second pair of circuit elements are independent;
the first circuit being configured to provide a first bias voltage to the transformer to adjust gate bias voltages of the first and second transistors; and
the second circuit being configured to provide a second bias voltage to the transformer to adjust gate bias voltages of the third and fourth transistors, wherein the adjustment of the gate bias voltages of the first and second transistors is independent from the adjustment of the gate bias voltages of the third and fourth transistors, wherein a combination of the first bias voltage and the second bias voltage increases an oscillation amplitude of the device and decreases a triode operation region of one or more of the first, second, third, and fourth transistors.

8. The apparatus of claim 7, wherein:
the transformer comprises a first winding, a second winding, and a third winding, the first winding being the coil having one turn;
the first winding is connected between the first node and the second node, and the first winding is magnetically coupled to the second winding and the third winding;
the second winding is connected between the first gate terminal and the second gate terminal; and
the third winding is connected between the third gate terminal and the fourth gate terminal.

9. The apparatus of claim 8, wherein:
the first bias voltage is received by the second winding; and
the second bias voltage is received by the third winding.

10. The apparatus of claim 7, wherein the first transistor and the second transistor are P-type metal-oxide-semiconductor (PMOS) transistor, and the third transistor and the fourth transistor are N-type metal-oxide-semiconductor (NMOS) transistors.

11. The apparatus of claim 7, wherein the first transistor and the second transistor are PNP bipolar transistors, and the third transistor and the fourth transistor are NPN bipolar transistors.

12. The apparatus of claim 7, wherein drain voltages measured at the first, second, third, and fourth drain terminals and gate voltages measured at the first, second, third, and fourth gate terminals vary independently.

13. The apparatus of claim 7, wherein the device is a voltage controlled oscillator (VCO).

14. A method for reducing phase noise in a voltage controlled oscillator (VCO), the method comprising:
providing a first transistor having a first gate terminal and a first drain terminal, a second transistor having a second gate terminal and a second drain terminal, a third transistor having a third gate terminal and a third drain terminal, and a fourth transistor having a fourth gate terminal and a fourth drain terminal;
decoupling the first, second, third, and fourth drain terminals from the first, second, third, and fourth gate terminals using a transformer, the transformer comprising a coil having one turn;
increasing an oscillation amplitude of the VCO by:
  providing a first bias voltage to the transformer to adjust gate bias voltages of the first transistor and the second transistor;
  providing a second bias voltage to the transformer to adjust gate bias voltages of the third transistor and the fourth transistor, wherein the adjustment to the gate bias voltages of the third and fourth transistors is independent from gate bias voltages of the first and second transistors;
  providing a first control voltage to a first pair of circuit elements to adjust capacitance of the first pair of circuit elements, the first pair of circuit elements being connected between the first and second gate terminals of the first and second transistors, respectively; and
  providing a second control voltage to a second pair of circuit elements to adjust capacitance of the second pair of circuit elements, the second pair of circuit elements being connected between the third and fourth gate terminals of the third and fourth transistors, respectively, wherein the adjustment to the capacitance of the first pair of circuit elements and the adjustment to the capacitance of the second pair of circuit elements are independent.

15. The method of claim 14, wherein:
the transformer comprises a first winding, a second winding, and a third winding, the first winding being the coil having one turn;
the first winding is connected between the first node and the second node, and the first winding is magnetically coupled to the second winding and the third winding;
the second winding is connected between the first gate terminal and the second gate terminal; and
the third winding is connected between the third gate terminal and the fourth gate terminal.

16. The method of claim 14, further comprising adjusting at least one of the first and second bias voltages until a combination of the first and second bias voltages maximizes the oscillation amplitude of the VCO.

17. The method of claim 14, further comprising reducing triode operation of the first, second, third, and fourth transistors by providing the first bias voltage and the second bias voltage to the transformer independently.

* * * * *